United States Patent
Nishikawa et al.

(10) Patent No.: US 7,560,858 B2
(45) Date of Patent: Jul. 14, 2009

(54) SEALING SUBSTRATE AND A PIXEL SUBSTRATE OF A DISPLAY DEVICE JOINED BY A METAL JOINT SOLDER

(75) Inventors: Ryuji Nishikawa, Gifu (JP); Tetsuji Omura, Ogaki (JP); Masaya Nakai, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 305 days.

(21) Appl. No.: 11/065,842

(22) Filed: Feb. 25, 2005

(65) Prior Publication Data

US 2005/0269940 A1 Dec. 8, 2005

(30) Foreign Application Priority Data

Mar. 1, 2004 (JP) ............................. 2004-055971

(51) Int. Cl.
*H01J 19/50* (2006.01)

(52) U.S. Cl. ...................... 313/292; 313/495; 313/500; 313/513

(58) Field of Classification Search ................. 313/495, 313/422, 484, 581, 292
See application file for complete search history.

(56) References Cited

U.S. PATENT DOCUMENTS 7,119,482 B2 * 10/2006 Tokioka et al. ............... 313/292
2004/0075378 A1 * 4/2004 Niibori et al. ................ 313/495

FOREIGN PATENT DOCUMENTS

JP 2001319775 11/2001

\* cited by examiner

*Primary Examiner*—Ashok Patel
(74) *Attorney, Agent, or Firm*—McCarter & English, LLP

(57) ABSTRACT

A metal solder layer is formed on a sealing substrate through patterning. A pixel substrate is overlapped to the sealing substrate and the solder layer is irradiated with laser so that the sealing substrate and the pixel substrate are connected. Because the joining is achieved by the metal solder layer, intrusion of moisture into the inside space can be reduced. In addition, the solder layer can be very precisely formed through patterning.

6 Claims, 3 Drawing Sheets

SEALING SUBSTRATE AND A PIXEL SUBSTRATE OF A DISPLAY DEVICE JOINED BY A METAL JOINT SOLDER

CROSS-REFERENCE TO RELATED APPLICATIONS

The entire disclosure of Japanese Patent Application No. 2004-55971 including specification, claims, drawings and abstract is incorporated herein by reference.

BACKGROUND OF THE INVENTION

1. Field of the Invention

The present invention relates to manufacture of a display panel such as an organic electroluminescence (hereinafter simply referred to as "EL") display panel and, in particular, to a sealing structure in the display panel.

2. Description of the Related Art

Plasma display panels (PDP) and liquid crystal display devices (LCD) are becoming widely available as thin flat display panels and organic EL panels are commercially available.

In an organic EL panel, an organic material is used as a light emitting material in each pixel or the like. Because the lifetime of the organic material is shortened when the organic material contains moisture, it is necessary to minimize an amount of moisture in a space in which the pixel is present. For this purpose, a sealing substrate is disposed to oppose, with a predetermined gap, an EL substrate on which display pixels including EL elements are formed in a matrix form and the peripheral portion of the substrates is air-tightly sealed with a sealing material made of a resin to prevent moisture from intruding into the inside. In addition, a desiccant is provided in the inside space to remove moisture.

As the sealing material, an epoxy-based ultraviolet curable resin or the like is used. However, in order to further improve the air-tightness, a method is proposed which uses a low-melting-point glass such as a solder glass (for example, Japanese Patent Laid-Open Publication No. 2001-319775).

In Japanese Patent Laid-Open Publication No. 2001-319775, a low-melting-point glass for joining substrates is sandwiched between glass substrates and is welded through heating. However, in such joining, it is difficult to precisely determine a line width and a position of the low-melting-point glass, and therefore, a sufficient margin must be provided in the joining portion. On the other hand, there is a demand for reducing the overall size of a display panel and to minimize an area of a peripheral region to be used for joining. There is another problem in that a distance between the substrates varies when an amount of the low-melting-point glass changes.

SUMMARY OF THE INVENTION

According to the present invention, a pixel substrate and a sealing substrate are joined using a metal solder. A metal has a very low permeability of moisture, and therefore, can reliably prevent intrusion of moisture into the inside and allows reduction of an amount of desiccant to be provided in the inside space, or, omission of such a desiccant. In addition, because a joint solder layer is formed through patterning, it is possible to very precisely form the solder layer. Therefore, the large margin for the joining area is no longer necessary, which allows for reliable sealing with a small area, an increase in a display region which actually realizes a display, and a reduction in the size of the display. Moreover, because the solder layer can be precisely formed, it is possible to prevent variation in the distance between substrates.

BRIEF DESCRIPTION OF THE DRAWINGS

Preferred embodiments of the present invention will be described in detail based on the following drawings, wherein.

DESCRIPTION OF PREFERRED EMBODIMENTS

Figure 1A:
FIGS. 1(a)-1(e) are diagrams showing a joining state of substrates according to a preferred embodiment of the present invention.

Preferred embodiments (hereinafter, referred to simply as "embodiment") of the present invention will now be described referring to the drawings.

FIGS. 1(a) through 1(e) show a procedure for joining substrates according to a preferred embodiment of the present invention. A mask film 12 is formed on a front surface of a sealing substrate 10 which is made of glass (FIG. 1(a)). As the mask film 12, a photosensitive resin which can withstand a temperature of approximately 200° C. is used. For example, a resin which is used for a color filter in the organic EL panel, an organic material which is used for an acrylic planarization film in the organic EL panel, or an inorganic material such as $SiO_2$ and SiN is used.

Figure 1B:
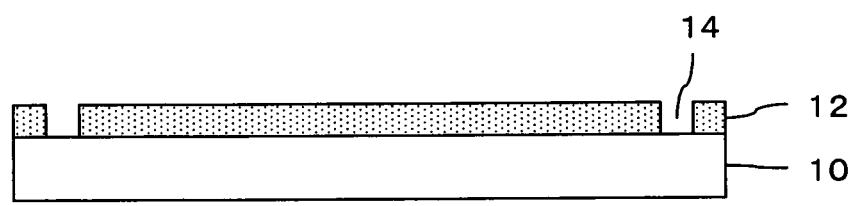

The mask film 12 is then exposed through a mask pattern and is developed, so that a frame-shaped groove 14 corresponding to the mask pattern is formed (FIG. 1(b)). Because the groove 14 is formed through photolithography, the precision of the groove 14 is very high and the groove 14 is very precisely formed in a predetermined position and a predetermined size.

Figure 1C:
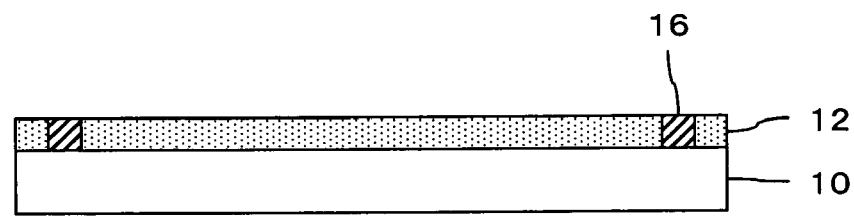

After the groove 14 is formed in this manner, a solder (metal) which is in a melted state is supplied to the groove 14 (FIG. 1(c)). Using the mask film 12 as a bank, a frame-shaped solder layer 16 is formed in the shape of the groove 14. The solder is a normal eutectic solder which is made of lead and tin, with a melting point of approximately 183° C. (less than 200° C.). With the mask film 12 having a thermal endurance of 200° C., this solder does not pose a problem. Some low-melting-point solders which use an alloy of bismuth or indium have a melting point of 100° C. or less, and thus, various materials can be used for the mask film 12 by using these solders.

Figure 1D:
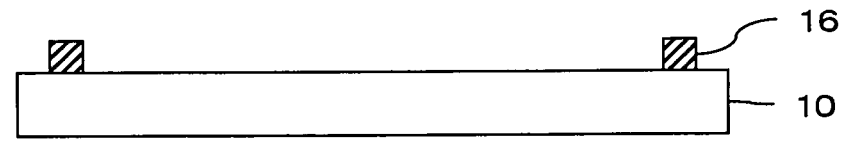

Then, the mask film 12 is removed by a method suitable for the material of the mask film (FIG. 1(d)). The mask film 12 may be removed through a wet process or a dry process, as long as the mask film 12 can be removed while the solder layer 16 remains.

Figure 1E:
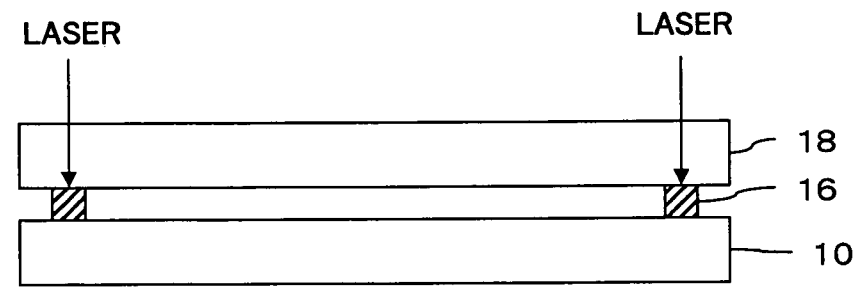

A pixel substrate 18 having a similar shape as that of the sealing substrate 10 is aligned with the sealing substrate 10 and is overlapped (FIG. 1(e)). In this manner, an adhesion portion at the peripheral of the pixel substrate 18 contacts the solder layer 16. In this state, the solder layer 16 is irradiated with laser through the pixel substrate 18 as shown in FIG. 1(e) so that the surface of the solder layer 16 melts, and the pixel substrate 18 is fixed to the solder layer 16.

In this manner, the pixel substrate 18 and the sealing substrate 10 are connected by the metal solder layer 16 at the adhesion portion on the peripheral.

As the laser, YAG laser (1064 nm) or the like is used. Laser light having a spot size which is slightly larger than, for example, the width of the solder layer is used and the solder layer 16 is scanned with the spot-shaped laser so that the solder layer 16 is heated.

In this manner, it is possible to connect the pixel substrate 18 and the sealing substrate 10 through soldering using laser. With the laser irradiation, because only the portion of the solder layer 16 which is irradiated with laser is heated, the sealed inside space is only slightly heated, and thus, the temperature of the inside space and the temperature of the outside space do not significantly change. Therefore, it is easy to suitably set the pressure in the inside space after the sealing process. In addition, because the sealing process is performed in a nitrogen atmosphere having substantially no moisture and sealing by a metal solder seal has a very high air-tightness, a probability that moisture will intrude into the inside space in the usage state in the atmosphere is low. Thus, it is not necessary to provide a desiccant in the inside space, and, furthermore, even when a desiccant is provided, the amount of the desiccant can be maintained very low. Moreover, the sealing process using the solder layer 16 requires a narrow width for the joining portion (adhesion portion) between the pixel substrate 18 and the sealing substrate 10 and the contact area is not widened due to the joining. Therefore, an area of the region for sealing at the peripheral of the EL substrate can be reduced and, consequently, the size of the display panel can be reduced.

A typical glass is used for the sealing substrate 10 and the pixel substrate 18. Therefore, the solder layer 16 does not mix with the glass and is fixed to the surface portion of the glass. For this purpose, it is preferable to roughen the surface of the sealing substrate 10 and pixel substrate 18 to form small projections and depressions. With such a structure, the shape of the solder becomes a shape which fits the projections and depressions on the surface, resulting in an increased fixing strength between the substrate and the solder layer.

Figure 2:
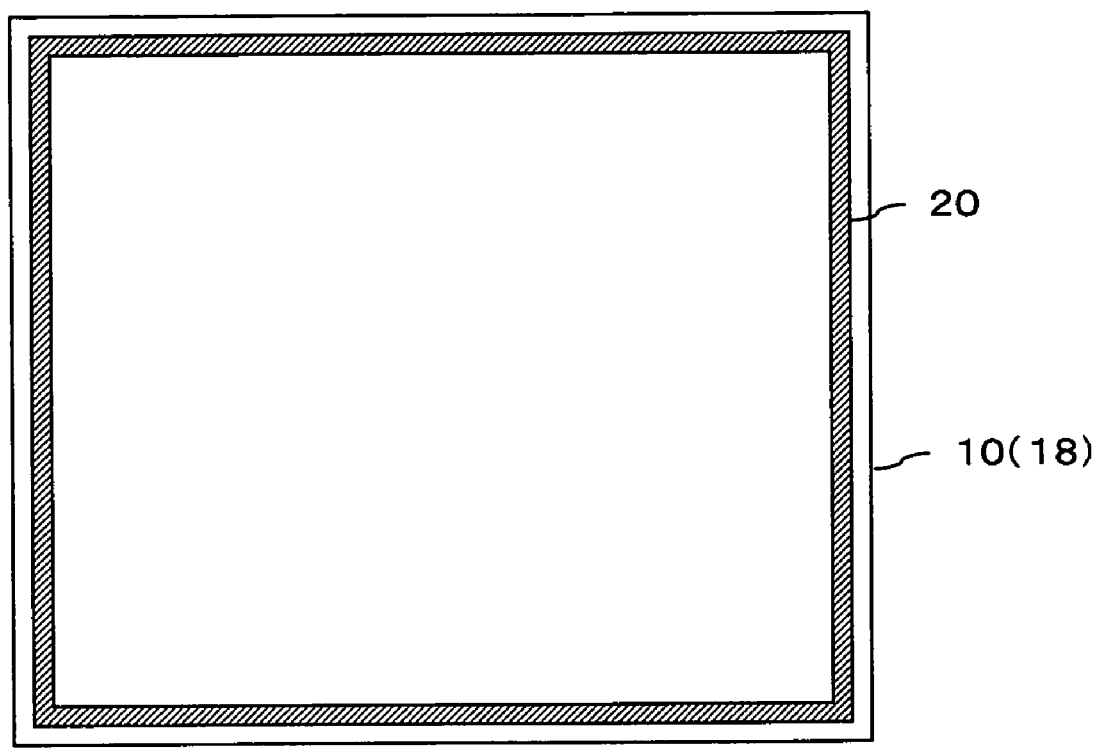
FIG. 2 is a diagram showing a joining portion of a substrate.

For example, as shown in FIG. 2, it is preferable to form a frame-shaped portion having a rough surface at a peripheral portion 20 of the sealing substrate 10 or pixel substrate 18. By fixing the solder layer 16 in this portion, a preferable seal can be achieved.

For roughening the surface of glass, it is preferable to employ a method such as sand blasting. A process for roughening the surface can be applied while only the peripheral portion 20 is exposed and other portions are covered by a mask. It is also preferable to further proceed with the sand blasting process to create the groove and to improve the adhesion properties between the solder layer 16 and glass. It is also possible to roughen the surface by dissolving a portion of the surface using a chemical agent.

It is also possible to improve the adhesion properties between the solder layer and glass by forming a film in the groove using a metal having a high adhesion property with solder such as silver (Ag) and copper (Cu) and then forming the solder layer 16. In this configuration, it is preferable that silver or copper is also formed on a corresponding portion of the pixel substrate 18.

In the above description of the present embodiment, a glass substrate is used as the pixel substrate 18 and the sealing substrate 10. However, the material of the substrates is not limited to glass as long as the substrates can be joined with solder, and various resin films or the like can be used as the substrate.

FIGS. 3(a)-3(d) show a procedure for joining substrates according to another preferred embodiment of the present invention. Similar to the above-described embodiment, a mask film 12 is formed on a front surface of a sealing substrate 10 (FIG. 3(a)), the mask film 12 is exposed through a mask pattern and is developed to form a groove 14 having a frame shape corresponding to the mask pattern (FIG. 3(b)). Here, a pattern in which the mask film 12 is removed in a display region of a pixel substrate 18 in which pixels are present is used as the mask pattern. Therefore, only the mask film 12 in a portion of a bank surrounding the groove will remain.

Figure 3A:
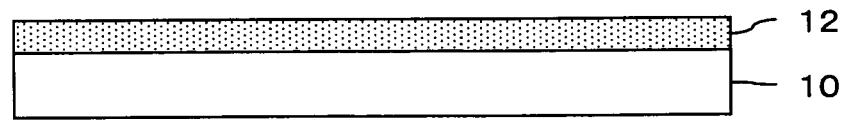
FIGS. 3(a)-3(d) are diagrams showing a joining state of substrates according to another preferred embodiment of the present invention.
Figure 3B:
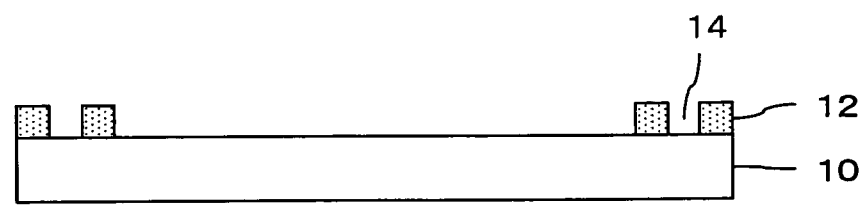
Figure 3C:
Figure 3D:
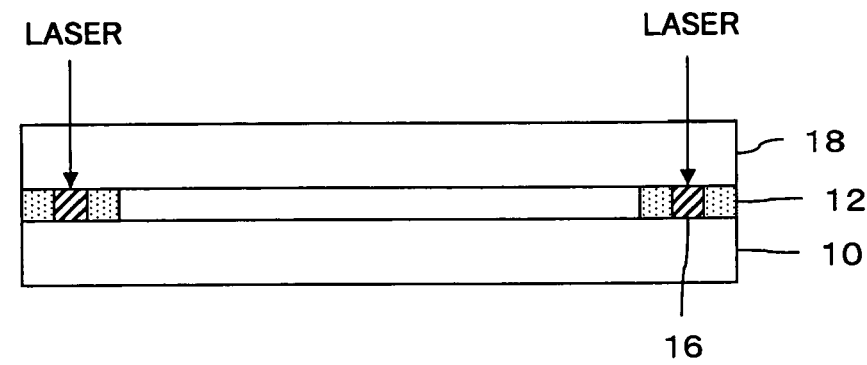

Then, solder (metal) in a melted state is supplied to the groove 14 of the remaining mask film 12 to form a frame-shaped solder layer 16 (FIG. 3(c)). While the mask film 12 and the solder layer 16 are maintained, a pixel substrate 18 is overlapped to the sealing substrate 10 (FIG. 3(d)), the solder layer 16 is irradiated with laser through the pixel substrate 18 in this state, a surface portion of the solder layer 16 is melted, and the pixel substrate 18 is fixed to the solder layer 16.

As described, in the present embodiment, the remaining mask film 12 functions as a bank also in the heating step of the solder using laser, and thus, it is possible to precisely join the pixel substrate 18 and the sealing substrate 10.

In this configuration also, it is preferable to roughen the front surface of the substrate in the adhesion portion and to roughen the inner side surface of the bank made of the mask film.

What is claimed is:

1. A display panel comprising a pixel substrate on which a plurality of display pixels are formed in a matrix form and a sealing substrate having a peripheral portion joined to a peripheral portion of the pixel substrate for sealing a space above the pixel substrate, wherein
the pixel substrate and the sealing substrate are joined and sealed at the peripheral portion by a metal joint solder layer which is formed through patterning, and
the surfaces of the pixel substrate, the sealing substrate, or the pixel substrate and the sealing substrate have projections and depressions in a formation region of the joint solder layer.

2. A display panel according to claim 1, wherein the solder layer is formed directly on the pixel substrate, the sealing substrate, or the pixel substrate and the sealing substrate.

3. A display panel according to claim 1, further including a metal layer formed on the pixel substrate, the sealing substrate, or the pixel substrate and the sealing substrate, and having a high adhesion property with the solder layer,
wherein the solder layer is formed on the metal layer.

4. A display panel comprising a pixel substrate on which a plurality of display pixels are formed in a matrix form and a sealing substrate having a peripheral portion joined to a peripheral portion of the pixel substrate for sealing a space above the pixel substrate, wherein
the pixel substrate and the sealing substrate are joined and sealed at the peripheral portion by a metal joint solder layer which is formed by patterning,
the surfaces of the pixel substrate, the sealing substrate, or the pixel substrate and the sealing substrate have projections and depressions in a formation region of the joint solder layer, and
a mask film pattern is placed on each of the sides of the joint solder layer.

5. A display panel according to claim 4, wherein
the solder layer is formed directly on the pixel substrate, the sealing substrate, or the pixel substrate and the sealing substrate.

6. A display panel according to claim 4, further including a metal layer formed on the pixel substrate, the sealing substrate, or the pixel substrate and the sealing substrate, and having a high adhesion property with the solder layer,
wherein the solder layer is formed on the metal layer.

* * * * *